US010911052B2

(12) United States Patent
Littmann et al.

(10) Patent No.: US 10,911,052 B2
(45) Date of Patent: Feb. 2, 2021

(54) MULTI-LEVEL SIGNAL CLOCK AND DATA RECOVERY

(71) Applicant: MACOM Technology Solutions Holdings, Inc., Lowell, MA (US)

(72) Inventors: Bengt Littmann, Newport Beach, CA (US); George L. Barrier, IV, Lowell, MA (US); Atul Gupta, Aliso Viejo, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 47 days.

(21) Appl. No.: 16/421,376

(22) Filed: May 23, 2019

(65) Prior Publication Data

US 2020/0007133 A1 Jan. 2, 2020

Related U.S. Application Data

(60) Provisional application No. 62/675,690, filed on May 23, 2018.

(51) Int. Cl.
*H03L 7/081* (2006.01)
*H04L 27/227* (2006.01)
*G04F 10/00* (2006.01)
*G06F 1/06* (2006.01)
*G06F 1/12* (2006.01)
*G06F 1/10* (2006.01)
(Continued)

(52) U.S. Cl.
CPC .......... *H03L 7/0816* (2013.01); *G04F 10/005* (2013.01); *G06F 1/06* (2013.01); *G06F 1/10* (2013.01); *G06F 1/12* (2013.01); *H04L 7/0058* (2013.01); *H04L 7/0334* (2013.01); *H04L 25/4917* (2013.01); *H04L 27/2272* (2013.01); *H04L 27/3809* (2013.01)

(58) Field of Classification Search
CPC .......... H04L 27/2272; H04L 25/03885; H04L 25/4917; H04L 7/0334; H04L 7/0058; H04L 7/227; H04L 27/03057; H04L 25/03057; H04L 27/3809; G06F 1/06; G06F 1/12; G06F 1/10; G04F 10/005; H03L 7/0816
USPC ........ 375/350, 317, 345, 340, 324, 326, 348
See application file for complete search history.

(56) References Cited

U.S. PATENT DOCUMENTS 4,719,643 A 1/1988 Beeman
4,947,425 A 8/1990 Grizmala et al.
(Continued)

*Primary Examiner* — Arnold M Kinkead
(74) *Attorney, Agent, or Firm* — Weide & Miller, Ltd.

(57) ABSTRACT

A system for retiming a multi-level signal that forms an eye diagram when plotted, such as a PAM4 signal that includes an equalizer configured to create an equalized signal and a first amplifier configured to amplify the equalized signal, responsive to a first amplifier control signal, to create a first amplified signal, and a second amplifier configured to amplify the equalized signal, responsive to a second amplifier control signal, to create a second amplified signal. An eye monitor processes the equalized signal, the first amplified signal, and the second amplified signal to create a first retiming clock phase signal and a second retiming clock phase signal, which control sampling times for flip-flops. One or more delays and one or more emphasis modules are configured to delay and introduce emphasis into an output from the flip-flops, the resulting signals are combined in a summing junction to create the retimed signal.

20 Claims, 12 Drawing Sheets

(51) Int. Cl.
   *H04L 25/49*    (2006.01)
   *H04L 7/033*    (2006.01)
   *H04L 27/38*    (2006.01)
   *H04L 7/00*     (2006.01)

(56) References Cited

U.S. PATENT DOCUMENTS

| | | |
|---|---|---|
| 5,210,712 A | 5/1993 | Saito |
| RE34,972 E | 6/1995 | Horiguchi et al. |
| 5,570,217 A | 10/1996 | Fleuren |
| 5,621,518 A | 4/1997 | Beller |
| RE35,607 E | 9/1997 | Nagamune et al. |
| 5,699,402 A | 12/1997 | Bauer et al. |
| 5,884,231 A | 3/1999 | Perdue et al. |
| 5,963,901 A | 10/1999 | Vahatalo et al. |
| 6,028,661 A | 2/2000 | Minami et al. |
| 6,075,628 A | 6/2000 | Fisher et al. |
| 6,317,062 B1 | 11/2001 | Payer et al. |
| 6,341,360 B1 | 1/2002 | Abdelilah et al. |
| 6,445,662 B1 | 9/2002 | Tonami |
| 6,512,610 B1 | 1/2003 | Minami et al. |
| 6,534,997 B1 | 3/2003 | Horishita et al. |
| 6,542,228 B1 | 4/2003 | Hartog |
| 6,547,453 B1 | 4/2003 | Stummer et al. |
| 6,873,279 B2 | 3/2005 | Jones et al. |
| 6,885,954 B2 | 4/2005 | Jones et al. |
| 7,474,720 B2 | 1/2009 | Yuuki et al. |
| 7,684,531 B2 | 3/2010 | Masui et al. |
| 8,548,110 B2 | 10/2013 | Lin et al. |
| 8,958,512 B1 * | 2/2015 | Ding ............... H04L 25/03885 375/350 |
| 2002/0114383 A1 | 8/2002 | Belge et al. |
| 2010/0027611 A1 * | 2/2010 | Dai ................ H04L 25/03057 375/233 |
| 2018/0262373 A1 * | 9/2018 | Shibasaki ........ H04B 10/6933 |

* cited by examiner

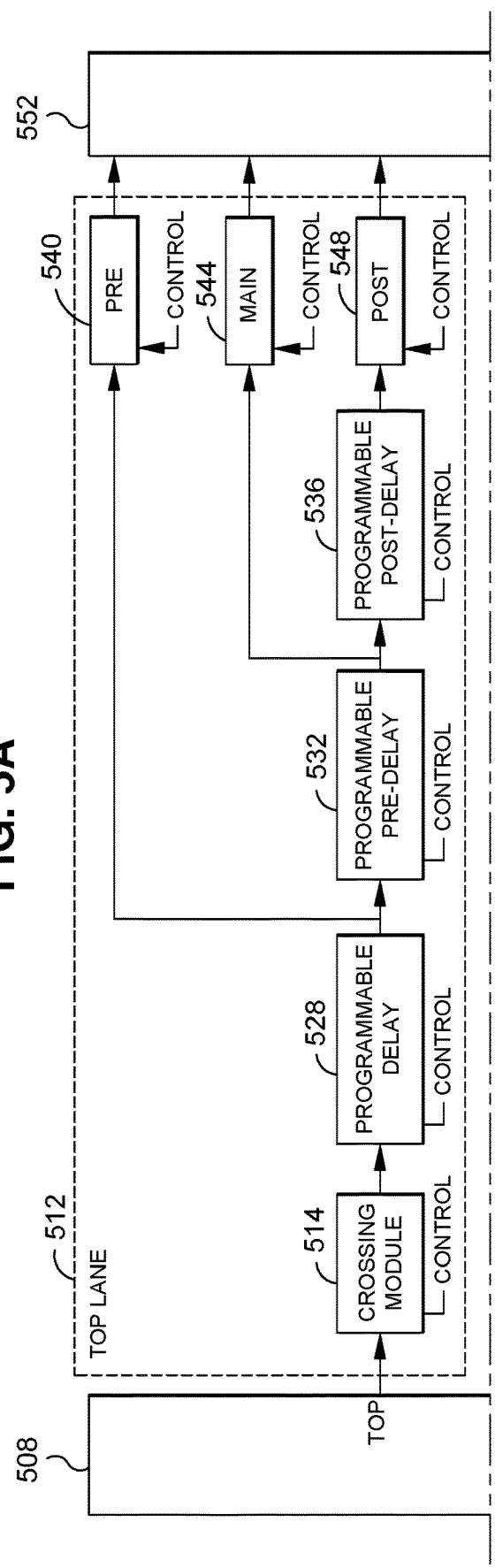

MULTI-LEVEL SIGNAL CLOCK AND DATA RECOVERY

FIELD OF THE INVENTION

This invention relates to signal decoding for data recovery and retiming prior to transmission for multilevel signals.

RELATED ART

Modern communication systems utilize signal coding to encode data on an analog signal. When a signal is received, the signal is analyzed at certain points in time, to determine the value of the received analog signal. This level is recorded and represents a data value. One example of such a signal is a two-level signal such as NRZ (non-return to zero) signaling, which is the incumbent signaling method for 3 Gbps and 6 Gbps.

FIG. 1 illustrates an exemplary NRZ signal having two signal levels. The signal 104 changes over time. It may assume a high level 108 or a low level 112. Sampling preferable occurs at time 120. The opening 116 between the high signal level 108 and the low signal level 112 is defined as the eye opening and a threshold level is at the midpoint between the high level and low level. Detected signal values above the threshold value are quantized to a high level, while detected signal values below the threshold are quantized to a low level. When the signal quality is poor, resulting in a poor quality signal eye, it is difficult for the processing elements and flip-flops to sample and recover the signal.

FIG. 2 illustrates a prior art signal decoder for use with PAM4 signal as shown in FIG. 2. In this embodiment, an input terminal 204 receives a signal received over the channel to be decoded. A CTLE (continuous time linear equalizer) 208 receives the incoming signal and performs linear equalization to counteract the effects of the channel on the received signal. In one embodiment, low frequency signal components may be attenuated while high frequency signal components are amplified (high-pass filter). In other embodiments, the CTLE 208 may be configured to perform other functions.

The CTLE 208 improves the signal to counter act the effects of the channel. When the eye is open the most, that is when the sampling occurs, from a horizontal timing aspect. The thresholds values are at a vertical level. When looking at the signal using an eye monitor and flip-flops, if the signal is above a flip-flop threshold level, then the flip-flop output is a logic 1 value. If the signal is below a threshold, then flip-flop output is a logic 0 value. If the signal value is at the lowest of the four levels, then all the flip-flop outputs would be a 0. The logic output of each flip-flop determines how to slice.

The output of the CTLE 208 feeds into an eye monitor 212, a top lane strong arm flip-flop 216, a middle lane strong arm flip-flop 220, and a bottom lane strong arm flip-flop 224. The eye monitor 212 receives the PAM2 signal and processes the signal to continuously or periodically monitor the signal to determine statistics about the signal including when to slice or sample the signal with the flip-flops 216, 220, 224. Stated another way, the eye monitor detects the eye of the signal and selects the best time for the signal to be sampled. To control sampling time, each flip-flop 216, 220, 224 receives the clock phase signal from the eye monitor 212. The clock phase signal controls the time at which the flip-flops compare the signal from the CTLE 208 to the threshold to determine at which of the levels the received signal is at the time of sampling. In this prior art embodiment, each flip-flop 216, 220, 224 receives the same clock phase signal. Each flip-flop provides an output, either a logic level 0 or logic level 1 depending on the comparison. A logic level 0 output from a flip-flop indicates the signal presented to the flip-flop is less than the threshold. A logic level 1 output from a flip-flop indicates the signal presented to the flip-flop is greater than the threshold. By processing the output from the flip-flops 216, 220, 224 the signal value can be determined at each slice or sampling point.

While the system of FIG. 2 worked well in prior art semiconductor processes and systems, such as CMOS, low cost semiconductor process technology, such as for example, BiCMOS are not well suited to this arrangement of elements. For example, strong arm flip-flops, which work particularly well in this example environment of use, are not functionally manufacturable in BiCMOS technology. Hence, this prior art embodiment is not suitable for use in a PAM4 BiCMOS implementations. As a result, there is a need in the art for a new system suitable for use with BiCMOS that overcomes the drawbacks of the prior art and which provides additional benefits.

FIG. 3A illustrates an exemplary PAM4 signal. In comparison to the two-level signal of FIG. 1, the PAM4 signal, at the time of sampling, may be at one of four different signal levels, thereby encoding 2 bits of data at each sampling point. In this embodiment time is represented on the horizontal axis while signal magnitude in volts is represented on the vertical axis. The four signal levels are levels 308, 312, 316, 320. Defining the transition between four signal levels are three threshold levels, namely, the bottom threshold, the middle threshold and the top threshold. At the time of signal detection, signals which are below the bottom threshold 330 are quantized to lowest signal level 308. At the time of signal detection, signals which are above the bottom threshold 330 but below the other two thresholds 332, 338 are quantized to the second signal level 312. At the time of signal detection, signals which are above the bottom threshold 330 and the middle threshold 334, but below the top threshold 338 are quantized to third highest signal level 316. At the time of signal detection, signals which are above the top threshold 338 are quantized to top or largest signal level 320.

Also shown in FIG. 3A are signal portions which are defined as the leading portion 350 of the signal, the middle portion 354 of the signal, and the trailing portion 358 of the signal. These terms are discussed below and defined herein to aid understanding.

FIG. 3B illustrates an exemplary PAM4 signal that has signal compression. As compared to FIG. 3A, identical signal features are identified with identical reference numbers. In this embodiment, the eye opening associated with threshold 338 is very open, but the lower eye opening associated with threshold 330 is compressed. This compression associated with the threshold 330 increases the error rate when sampling the combined signal. If the compression occurs across all channels, it can be corrected by amplifying the entire signal, but when compressing does not occur uniformly, correction is a challenge for prior art systems.

FIG. 3C illustrates an exemplary PAM4 signal that has skewed input eyes due to unequal laser rise and fall times. As compared to FIG. 3A and 3B, identical signal features are identified with identical reference numbers. In this signal plot, the eye openings do not align in time. For example, at a time T 360, the center of the eye openings do not align with the other eye openings. Signal sampling at time T 360 will accurately sample certain signal levels but not others due to the skewed signal eyes.

SUMMARY

To overcome the drawbacks of the prior art a method for signal clock and data recovery is disclosed comprising receiving a signal for clock and data recovery and then performing equalization on the signal to create an equalized signal such that the equalization occurs to reverse the effects of a channel on the signal. Then, presenting the equalized signal to an eye monitor and at least a first amplifier and a second amplifier. Responsive to a first control signal, amplifying the equalized signal with the first amplifier to generate a first amplified signal and providing the first amplified signal to the eye monitor and a first flip-flop. Responsive to a second control signal, amplifying the equalized signal with the second amplifier to generate a second amplified signal and providing the second amplified signal to the eye monitor and a second flip-flop. Then processing the equalized signal, the first amplified signal and the second amplified signal with the eye monitor and responsive to the processing generating a first retiming clock phase signal for the first flip-flop and a second retiming clock phase signal for the second flip-flop. The first retimed signal is provided to the first flip-flop and the second retiming clock phase signal is provided to the second flip-flop. Sampling the first amplified signal with the first flip-flop in relation to a first threshold based on the first retiming clock phase signal to generate a first flip-flop output and sampling the second amplified signal with the second flip-flop in relation to a second threshold based on the second retiming clock phase signal to generate a second flip-flop output. This method of operation then processes at least the first flip-flop output and the second flip-flop output to generate a retimed representation of the received signal.

In one embodiment, the first amplifier and the second amplifier are limiting amplifiers with offset correction. This method may further include use of a multiplexer to selectively switch the equalized signal or one of the amplified signals to the eye monitor. The eye monitor may comprise any processing device configured to perform as described herein by analyzing signals presented to it to evaluate the eye opening and other parameters to generate one or more control signals to optimize signal quality, gain, and/or sampling time. In one configuration, the first flip-flop and the second flip-flop are BiCMOS technology but in other embodiments other processes may be used.

This method may further comprise presenting the equalized signal a third amplifier and responsive to a third control signal, amplifying the equalized signal with the third amplifier to generate a first amplified signal. Then, providing the third amplified signal to the eye monitor and a third flip-flop. When processing the equalized signal, the first amplified signal, and the second amplified signal, also processing the third amplified signal with the eye monitor and responsive to the processing generating a third retiming clock phase signal for the third flip-flop, which is provided to the third flip-flop. Then, sampling the third amplified signal with the third flip-flop in relation to a third threshold based on the third retiming clock phase signal to generate a third flip-flop output, and when processing the first flip-flop output and the second flip-flop output, also processing the third flip-flop output to generate a retimed representation of the received signal.

In one embodiment, this method may further comprise delaying the first flip-flop output with a first delay path to create one or more delayed first signals and delaying the second flip-flop output with a second delay path to create one or more delayed second signals. Also, processing the one or more delayed first signals with a first emphasis module group to impart emphasis into the one or more delayed first signals to create one or more first output signals which are provided to a summing junction. Similarly, processing the one or more delayed second signals with a second emphasis module group to impart emphasis into the one or more delayed second signals to create one or more second output signals which are provided to the summing junction. Thereafter, combining the one or more first output signals and the one or more second output signals with the summing junction to create a retimed signal. In this embodiment, the first delay path and the second delay path comprise a programable main delay, a programable pre-delay and a programable post-delay. Further, the first emphasis module group and the second emphasis module group may comprise a pre-emphasis module, a main-emphasis module, and a post-emphasis module.

Also disclosed is a system for retiming signals comprising an input configured to receive a signal and an equalizer configured to perform equalization on the received signal to create an equalized signal. Two or more amplifiers receive the equalized signal and, responsive to amplifier control signals, amplify the equalized signal to create two or more amplified signals. An eye monitor is configured to receive and process the equalized signal and the two or more amplified signals to create two or more retiming clock phase signals. Also, part of this embodiment are two or more flip-flops configured to receive the two or more amplified signals and, responsive to the two or more retiming clock phase signals, sample the two or more amplified signal to create two or more flip-flop outputs.

In one embodiment, the received signal is a PAM4 signal. It is contemplated that the two or more amplifiers comprise three limiting amplifiers and the two or more flip-flops comprise three flip-flops. The system may further comprise a multiplexer configured to receive the equalized signal and the two or more amplified signals and also, responsive to a multiplexer control signal, output the equalized signal and the two or more amplified signals to the eye monitor.

In one variation, the two or more amplifier control signals comprise an individual control signal for each amplifier that is capable of controlling offset for each amplifier. To provide unique control, the step of creating two or more retiming clock phase signals with the eye monitor comprises creating an individual retiming clock phase signal for each flip-flop to establish a retiming clock signal for each flip-flop. The system may further comprise, for each flip-flop, one or more delays configured to receive a flip-flop output and introduce a delay into the flip-flop output to create delayed signals, as well as one or more emphasis modules configured to receive the delayed signals and introduce emphasis into the delayed signal, and a summing junction configured to receive and combine the output of the emphasis modules into a combined signal. In such a configuration, the delays may include a pre-delay and a post-delay, and the emphasis modules include a pre-emphasis module, a main-emphasis module and a post-emphasis module.

Also disclosed herein is system for retiming a multi-level signal, in one embodiment, the system comprises an equalizer configured to perform equalization on a received signal to create an equalized signal. Also part of this embodiment is a first amplifier configured to receive and amplify the equalized signal, responsive to a first amplifier control signal, to create a first amplified signal, and also a second amplifier configured to receive and amplify the equalized signal, responsive to a second amplifier control signal, to create a second amplified signal. An eye monitor is configured to receive the equalized signal, the first and the second amplified signals, and then to further process the equalized signal and, the first and the second amplified signals to create a first retiming clock phase signal and a second retiming clock phase signal. The eye monitor then provides the first retiming clock phase signal to a first flip-flop and the second retiming clock phase signal to a second flip-flop.

A first flip-flop is provided and configured to receive the first amplified signal and the first retiming clock phase signal and sample the first amplified signal at a time controlled by the first retiming clock phase signal. A second flip-flop is configured to receive the second amplified signal, and the second retiming clock phase signal, and sample the second amplified signal at a time controlled by the second retiming clock phase signal.

In one embodiment, the system further comprises one or more first delays and one or more first emphasis modules configured to delay and introduce emphasis into an output from the first flip-flop to create a first output. This embodiment also includes one or more second delays and one or more second emphasis modules configured to delay and introduce emphasis into an output from the second flip-flop to create a second output. A summing junction is provided and configured to receive and combine the first output and the second output to generate a combined output representing a retimed signal. In one configuration, the one or more first delays and one or more second delays each comprise a delay, a pre-delay, and a post delay, and the one or more emphasis modules include a pre-emphasis module, a main-emphasis module, and a post emphasis module.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 5 is an index figure showing the relationship between FIG. 5A and 5B.

FIGS. 5A and FIG. 5B illustrate a block diagram of an example embodiment of a pre-transmission signal modification system.

DETAILED DESCRIPTION

Figure 1:
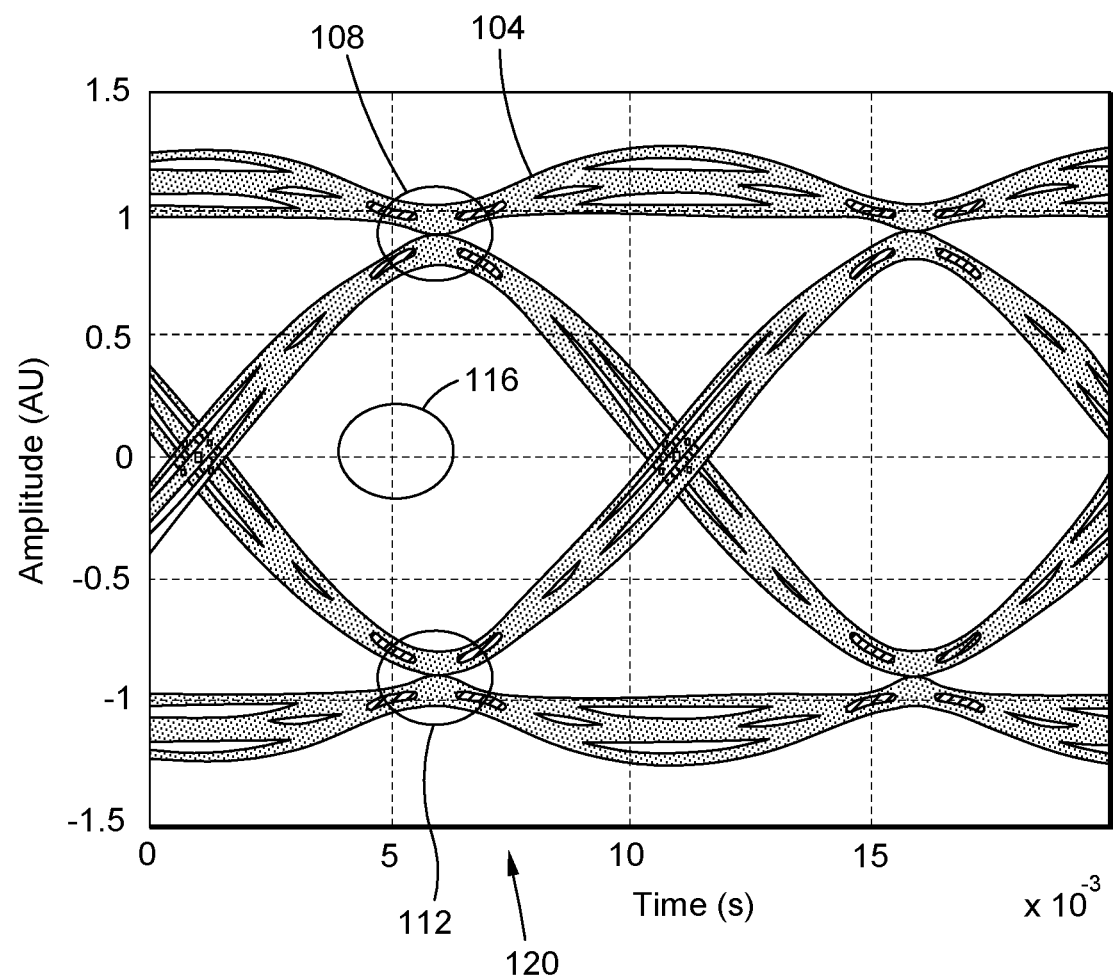
FIG. 1 illustrates an exemplary NRZ signal having two signal levels.
Figure 2:
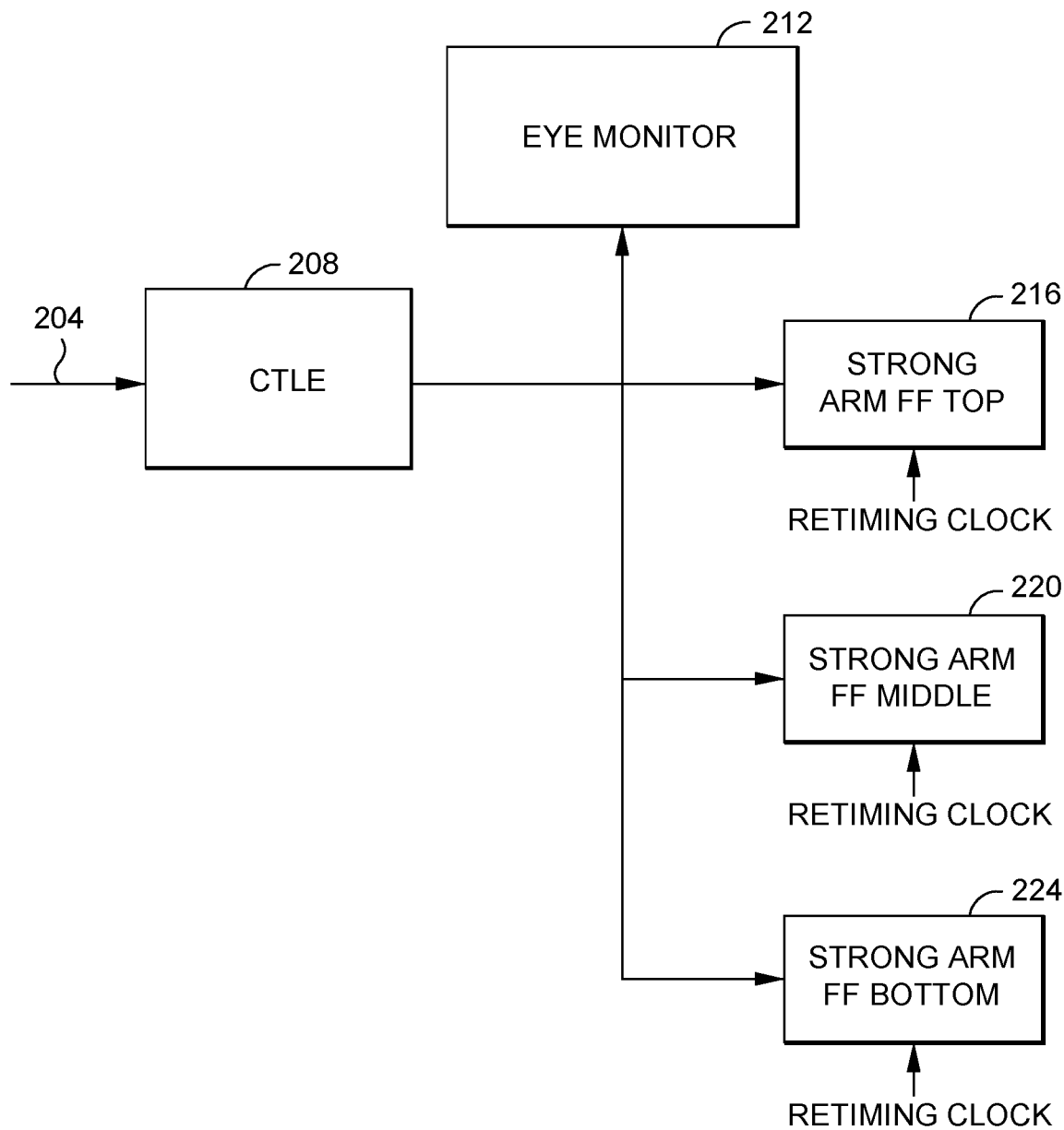
FIG. 2 illustrates a prior art signal decoder for use with PAM4 signal as shown in FIG. 2.
Figure 4:
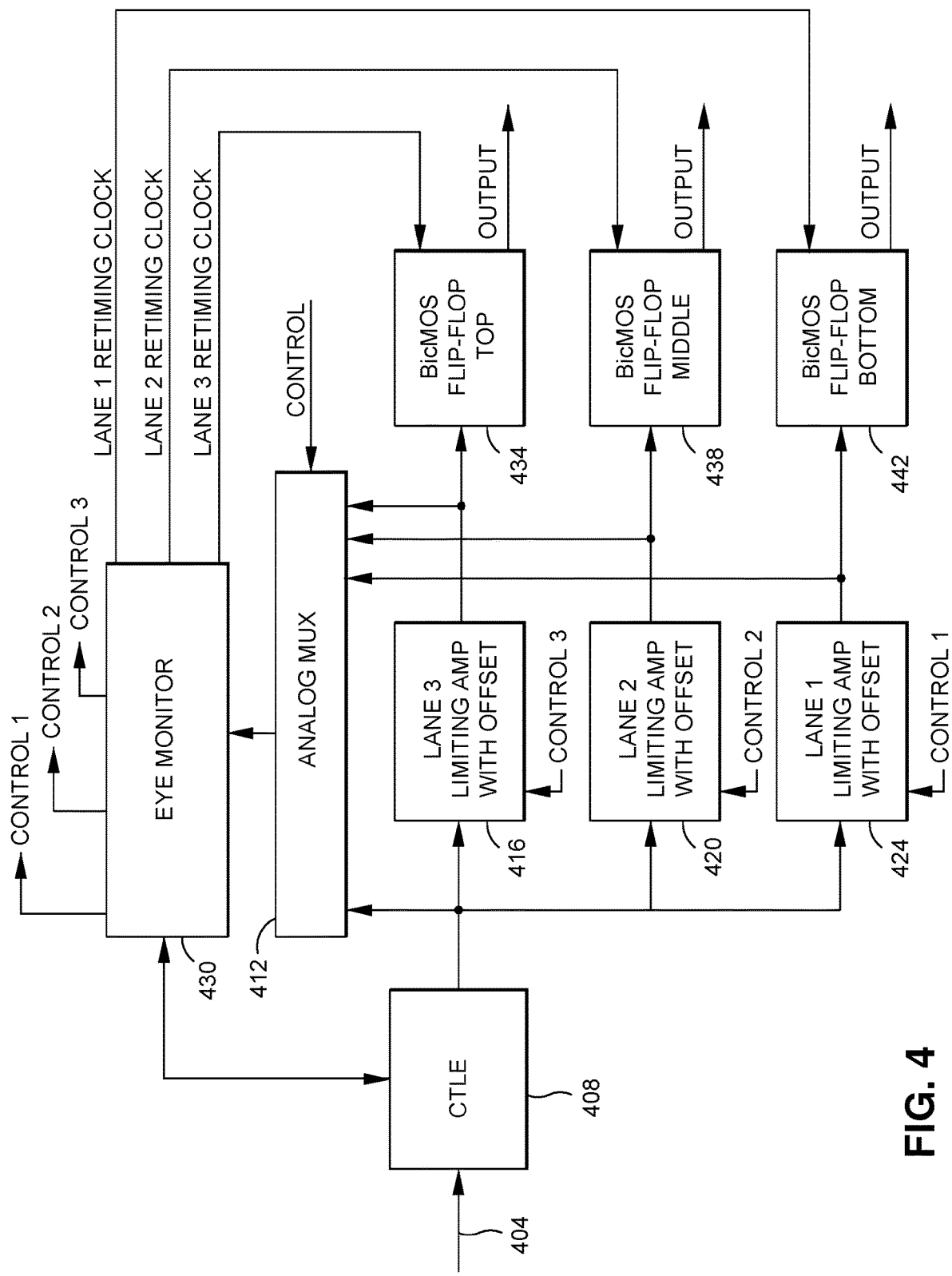
FIG. 4 illustrates a block diagram of an example embodiment of a signal decoder for a PAM4 signal using BiCMOS technology.

FIG. 4 illustrates a block diagram of an example embodiment of a signal decoder for a PAM4 signal using BiCMOS technology. This is but one possible example embodiment, and it is contemplated that other embodiments may be enabled and configured without departing from the scope of the invention. As compared to FIG. 2, similar elements are described in detail, but those elements' configuration and operation may change due to the changed nature of this embodiment. A received signal is received on input 404 and presented to a CTLE 408 for equalization processing. The signal received on the input 404 may arrive from a host driver, such as an ASIC, a switched signal from another element, or from an electrical (wired) or optical channel. The equalized signal is provided to an analog multiplexer 412 and three limiting amplifiers, namely a lane 3 limiting amplifier 416, a lane 2 limiting amplifier 420, and a lane 1 limiting amplifier 424. In one embodiment the equalization is fixed. In another embodiment the equalization adjustable, based on a control signal, from the eye monitor 430 to the equalizer 408.

The limiting amplifiers 416, 420, 424 amplify the signal from the CTLE 408 to establish the signal at a magnitude suitable for processing by the BiCMOS flip-flops. A control signal is provided to the limiting amplifiers as shown. In one embodiment the control signal is from the eye monitor 430. The control signal may be digital or analog. Each limiting amplifier 416, 420, 424 receives its own control signal. The limiting amplifiers 416, 420, 424 provide an amplified output signal to the flip-flops. In particular, lane 3 limiting amplifier 416 provides an amplified signal to flip-flop 434, lane 2 limiting amplifier 420 provides an amplified signal to flip-flop 438, and lane 1 limiting amplifier 424 provides an amplified signal to flip-flop 442. The limiting amplifiers extend the signal in the vertical direction to expand or open the eye in a vertical direction. In this embodiment, each limiting amplifier can be individually controlled to provide different amounts of gain and/or offset. In contrast, the prior art did not provide individual gain control and/or offset control for each lane. Although shown with three lanes for a PAM4 signal processing system, this arrangement may be extended to any number of different lanes or signal levels without departing from the scope of the invention.

The limiting amplifiers 416, 420, 424 are also configured with optional offset. The received signal may have offset between lanes or the limiting amplifier, due to the nature of amplifier operation, may introduce offset into the signal. The added offset adjustment that is included with the limiting amplifiers 416, 420, 424 is configured to counteract or reverse any offset that is introduced in the signal by the limiting amplifier's amplification of the signal(s) or which otherwise exists in the signal(s).

The limiting amplifiers 416, 420, 424 may also have bandwidth limitations that affect the signal. By processing the signal input to the amplifiers and output from the amplifiers, the eye monitor 430 can detect unwanted bandwidth limiting by the limiting amplifiers and correct this in the amplifier or the CTLE 408. In one embodiment, the eye monitor 430 performs digital processing. The eye monitor may include one or more analog to digital converters (not shown). For example, if the limiting amplifier is bandwidth limited it will collapse the eye making decoding very difficult, but the CTLE processing can improve this aspect. The eye monitor 430 communicates with the limiting amplifiers and the CTLE or can affect the control signal to these elements.

As shown, the output of the CTLE 408 and the limiting amplifiers 416, 420, 424 are provided to an analog multiplexer (MUX) 412. The MUX is configured to selectively output, responsive to a control signal, either the input from the CTLE 408 or the limiting amplifiers 416, 420, 424 to an eye monitor 430. It is contemplated that the control signal provided to the analog MUX 412 is a digital signal that may be for the eye monitor 430 or from some other control element. In one embodiment, the switching occurs in a round robin fashion. As a result, the eye monitor 430 selectively receives the CTLE output before amplification and the CTLE output after amplification.

The eye monitor 430 serves several functions in this example embodiment. One task performed by the eye monitor 430 is signal processing to determine the best time to sample the received signal. In this function, the eye monitor 430 processes the signal and determines the timing of the signal peak or the maximum eye opening in the signal to determine the point in time when the signal should be sampled by the flip-flops 434, 438, 442. The sampling control (retiming clock phase) are output from the eye monitor 430 and individual retiming clocks, namely lane 1 retiming clock, lane 2 retiming clock, and lane 3 retiming clock. In one embodiment, the retiming clock phase signal is a digital signal. In this embodiment, each flip-flop receives its own unique retiming clock phase signal thereby allowing the sample time for each lane to be individually adjusted by the eye monitor 430 based on the signal evaluation by the eye monitor. By providing individual control over each lane, the sampling time for each lane can be individually adjusted to account for signal offset of phase differences between lanes. This is an improvement over the prior art which utilized a single sampling clock phase across all lanes.

A clock recovery module 454 is provided as shown. In this embodiment, the clock recovery module recovers the clock from the middle lane (lane 2) and provide a clock recovery signal to each of the flip-flops 434, 438, 442.

The eye monitor 430 also compares the signal received prior to amplification and after amplification. During the comparison the eye monitor evaluates the signal to determine the effects of amplification to evaluate if the amplification is having an adverse effect on the signal. If the gain and bandwidth is degrading the signal or causing the signal to be difficult to sample and decode, the gain and bandwidth can be adjusted, offset can be adjusted, or the eye monitor 430 may send a signal to the CTLE 408 to adjust the nature of the equalization that is performed on the received signal to pre-equalize for the amplification by the limiting amplifiers 416, 420, 424. As shown, the eye monitor 430 may be configured to be in communication with the CTLE 408 to adjust CTLE settings. The eye monitor 430 may also be in communication with the limiting amplifier 416, 420, 424 (connections not shown) or determine or change the control signals to the limiting amplifiers to thereby control amplification and/or offset. In one embodiment, the limiting amplifiers receive a control signal to adjust gain and offset. The eye monitor 430 may provide the control signal to the MUX 412 or the control signal to the MUX may come from another element, such as a processor, controller, or hardwired to alternate between MUX inputs. In one embodiment, the MUX is eliminated, and both signals are provided directly to the eye monitor 430.

The eye monitor 430 also analyzes the signal in both the vertical and horizontal direction to set not only the sample points but also the thresholds. The threshold (levels 330, 334, 320 in FIGS. 3A, 3B and 3C) are typically set at the midpoint between signal levels or at the middle, in the vertical direction, between signal values. Updated threshold values maybe provided to the flip-flops 434, 438, 442 from the eye monitor 430 or to the limiting amplifiers 416, 420, 424 which adjust the signal through amplification. The eye monitor 430 may provide the control signals to the limiting amplifiers 416, 420, 424.

The flip-flops 434, 438, 442 operate as described above but are in this configuration BiCMOS technology. The amplified signal is provided to the flip-flop as shown and sampling occurs at a time designated by the lane specific retiming clock phase signal. The flip-flops 434, 438, 442 compare the received signal to the thresholds (levels 330, 334, 338 in FIGS. 3A, 3B and 3C) and the resulting outputs, which are logic level 0 or 1 values indicate the magnitude of the received signal in relation to the threshold values. The resulting flip-flop outputs determine which signal value 308, 312, 316, 320 the received signal should be quantized. Each flip-flop 434, 438, 442 has an output as shown.

The configuration of FIG. 4 has several advantages over prior art systems. One such advantage of this configuration is that it allows the use of low cost BiCMOS technology. Another benefit is that there is an independent clock phase for top, middle and bottom eye (paths) which allows this system to achieve ideal operation with PAM4 eyes (signals) where there is timing skew between the top, middle and bottom eyes.

Figure 5B:
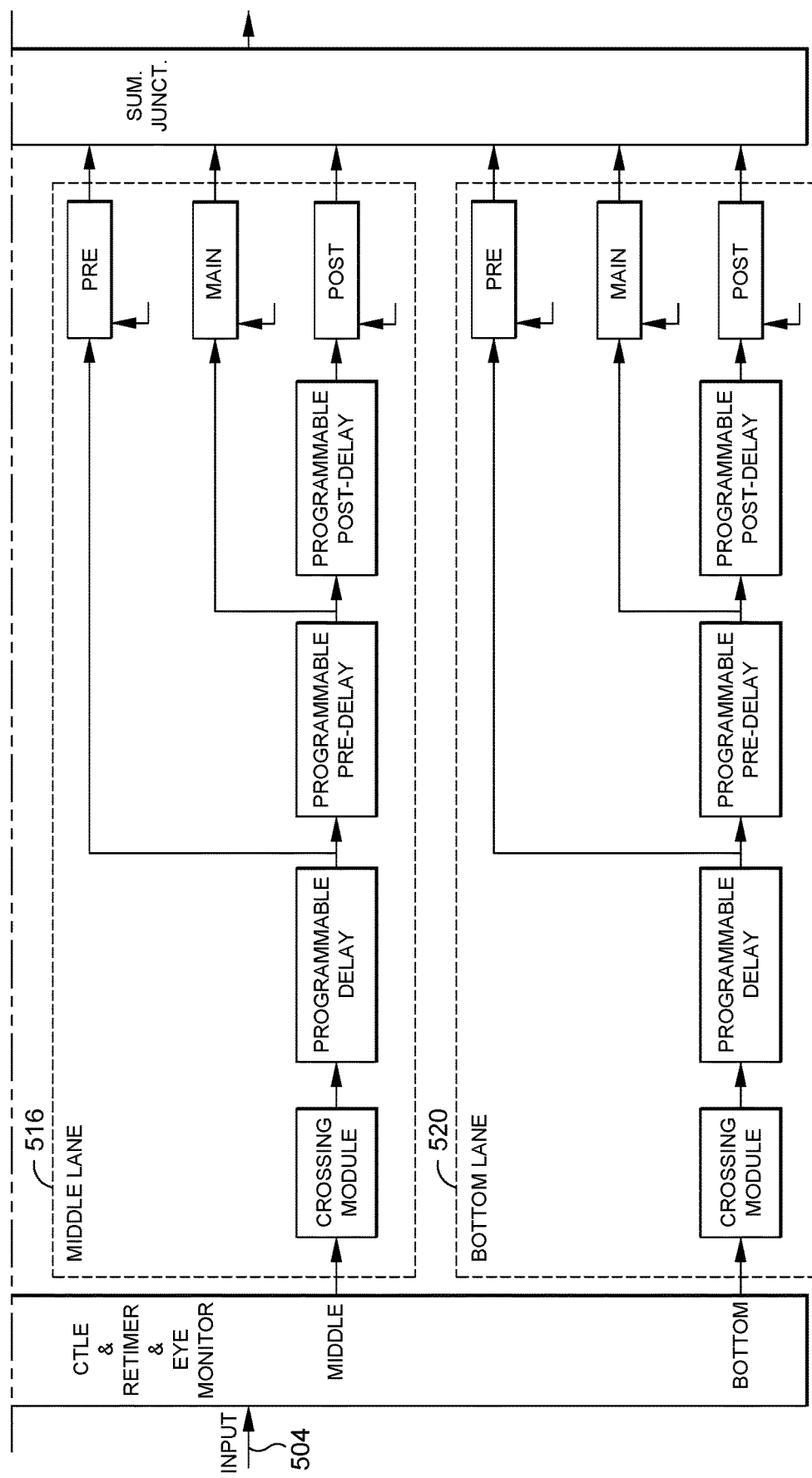

FIG. 5 is an index figure showing the relationship between FIG. 5A and 5B. A block diagram of an example embodiment of a pre-transmission signal modification system is illustrated in FIGS. 5A and 5B. This is but one possible embodiment as such it is contemplated that others may develop other embodiments which do not depart from the inventive scope of the invention. In this embodiment, an input signal is provided on an input 504 to the CTLE/Retimer/Eye Monitor 508, which is the same unit as the elements as shown in FIG. 4. The output of the CTLE/Retimer/Eye Monitor 508 represents the flip-flop output and is divided into three lanes, a top lane 512, a middle lane 516, and a bottom lane 520. The three lanes are generally similar and for purposes of discussion only the top lane 512 is discussed in detail.

The output from the CTLE/Retimer/Eye Monitor 508 for the top lane feeds into a crossing module 514, which may also be referred to as a multiplexer. The crossing module 514 also received a control signal on a control input as shown. The output of the crossing module 514 feeds into a programmable delay 528. The programmable delay 528 also receives a control signal on a control input as shown. The output of the programmable delay 528 feeds into a programmable pre-delay 532 and to a pre-emphasis module 540. The programmable pre-delay 532 also receives a control signal on a control input as shown. The output of the programmable pre-delay 532 feeds into a programmable post-delay 536 and to a main-emphasis module 544. The programmable post-delay 536 also receives a control signal on a control input as shown. The output of the programmable post-delay 536 feeds into a post-emphasis module 548. Each of the pre-emphasis module 540, main-emphasis module 544, and post-emphasis module 548 receive a control signal on a control input as shown. Each of the pre-emphasis module 540, main-emphasis module 544, and post-emphasis module 548 provide an output to a summing junction 552.

In operation, the CTLE/Retimer/Eye Monitor 508 receives an input signal and processes it according to the description of FIG. 4. The CTLE/Retimer/Eye Monitor 508 provides outputs to the top lane, middle lane, and bottom lane at shown. The values provided are flip-flop outputs. In reference to the top lane, the crossing module 524 processes the signal to adjust the duty cycle of the eye of the signal, or enables insertion of an external signal, such as loop back, PRBS (pseudorandom binary sequence) or other type signal/information. Typically, the eye is symmetric, but using the crossing module 524 and other elements described herein, the appearance and structure of the eye of the signal may be adjusted such as for example, wider on the top or smaller on the bottom. Thus, both the top and bottom of the eye may be adjusted with separate controls for the top portion and bottom portion of the signal that forms the eye. Each of the three lanes, 512, 516, 520 has this degree of adjustment. The control signal presented to the crossing module 524 controls how the eye is adjusted with regard to duty cycle and may also or alternatively, enable insertion of an external signal, such as loop back, PRBS (pseudorandom binary sequence) or other type signal/information. The prior art only provides one adjustment for the entire signal, and therefore lacks the level of control shown.

The crossing point module output is provided to the programmable delay 528. The programmable delay 528 delays the entire signal, so both the pre-portion of the signal and the post-portion of the signal. The control signal provided to the programmable delay 528 control the amount of delay, if any, that occurs within the programmable delay. Each lane's programmable delay 528 is individually controllable and hence each lane may have different amount of delay applied to each signal.

The output of the programmable delay 528 is provided to the programmable pre-delay 532. The output of the programmable delay 528 is also provided to the pre-emphasis module 540, the operation of which is discussed below. The programmable delay 528 shifts or delays the entire signal. The programmable pre-delay 532 delays only the leading portion of the signal but not the trailing portion of the signal. The control signal provided to the programmable pre-delay 532 controls the amount of delay, if any, that occurs within the programmable pre-delay. Each lane's programmable pre-delay 532 is individually controllable and hence each lane may have a different amount of delay applied to the leading portion of signal.

The output of the programmable pre-delay 532 is provided to the programmable post-delay 536. The output of the programmable pre-delay is also provided to the main-emphasis module 544, the operation of which is discussed below. The programmable post-delay 532 delays only the trailing portion of the signal but not the leading portion of the signal. The control signal provided to the programmable post-delay 536 controls the amount of delay, if any, which occurs within the programmable post-delay. Each lane's programmable post-delay 536 is individually controllable and hence each lane may have a different amount of delay applied to the trailing portion of the signal. The output of the programable post-delay 536 feeds into a post-emphasis module 548.

The emphasis modules, defined as the pre-emphasis module 540, main-emphasis module 544, and post-emphasis module 548, are configured to increase or decrease the magnitude of certain parts of the signal. Stated another way, the emphasis modules increase or decrease the magnitude of the signal. This adjustment is helpful because non-linear amplifiers can introduce non-linearities or linearities that change with bandwidth. This may be considered a non-linear pre-correction before transmission. In particular, the pre-emphasis module 540 increases or decreases the magnitude of the leading portion of the signal for a particular lane. The main-emphasis module 544 increases or decreases the magnitude of the main or middle portion of the signal for a particular lane. The post-emphasis module 548 increases or decreases the magnitude of the trailing portion of the signal for a particular lane.

The output of each emphasis module 540, 544, 548 feeds into a summing junction 552 that is configured to combine the signals into a single output as shown. The summing junction 552 could be a differential pair acting as a summing junction or it could be passive elements, such as resistors, configured as a summing junction.

The control signals which are presented to the various elements and modules are from a register or memory that is set by the customer or set at the time of manufacturing or testing. For example, the control values may be customer adjustable values stored in the register or memory. It is also contemplated that the control values may be dynamically adjusted during operation based on input from one or more sensors or feedback signals from the system. In addition, some values may start as fixed values stored in a register or memory and then be updated or changed over time or based on the quality of the eye of the signal to optimize the signal and eye of the signal.

The system described herein is also configured to correct for phase differences or staggering between signals on the top, middle, and bottom lanes. If there is staggering or phase differences in the signal, the sampling timing may occur at different times for each lane and thus not be lined up. Using the delays, this can be corrected for to have the sample time more aligned across lanes.

Figure 6A:
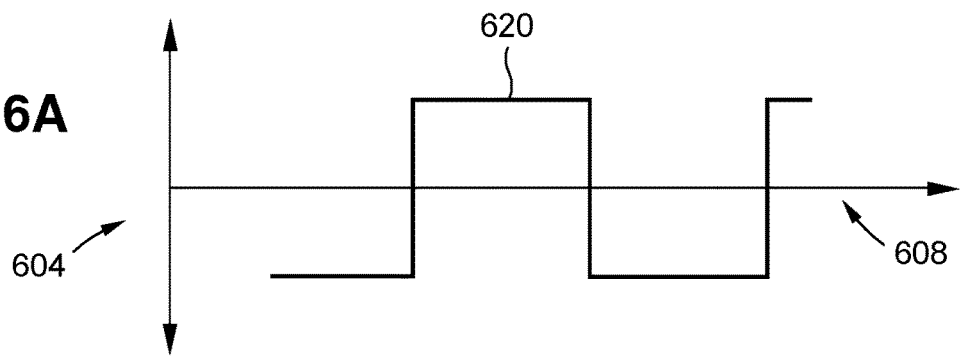
FIGS. 6A, 6B, 6C, and 6D illustrate example signal plots showing a baseline signal and different types of emphasis.
Figure 6B:
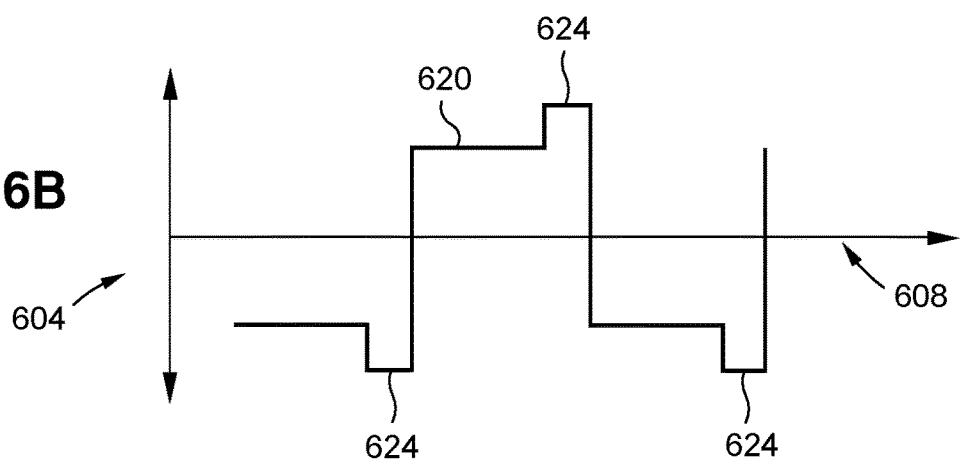
Figure 6C:
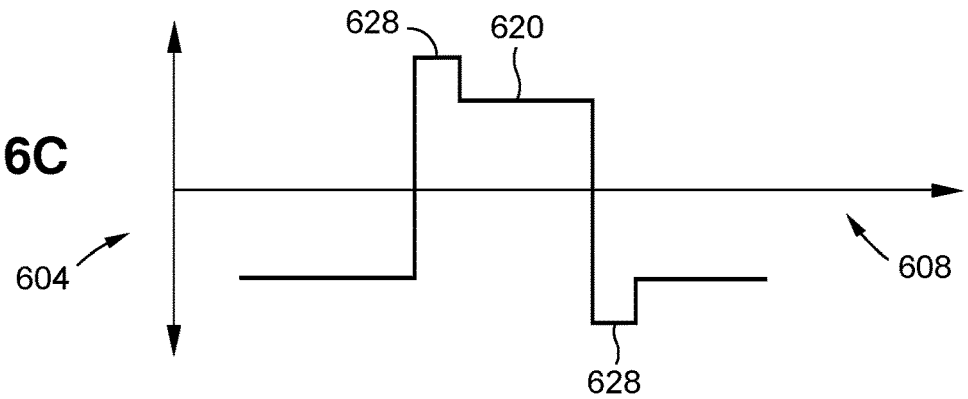
Figure 6D:
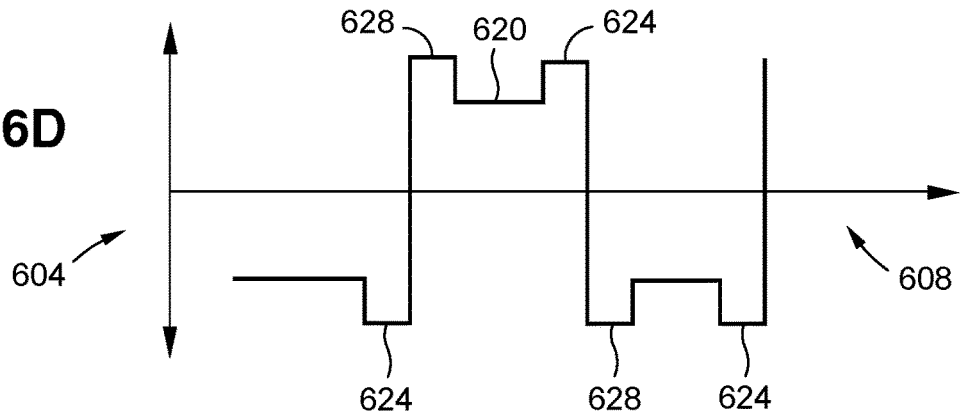

FIGS. 6A-6D illustrates example signal plots showing a baseline signal and different types of emphasis. In these figures, identical reference numbers are used in all figures to designate identical elements. The vertical axis 604 represents signal magnitude while the horizontal axis 608 represents time. As shown in FIG. 6A, a signal plot 620 is a typical square wave signal. However, after or before signal transmission, due to the nature of the channel, device behavior, the laser, or any combination thereof the signal may change. FIG. 6B illustrates the signal plot 620 with pre-emphasis 624 added to the signal plot. The pre-emphasis 624 increases signal magnitude just before the signal transition. FIG. 6C illustrates the signal plot 620 with post-emphasis 628 added to the signal plot. The post-emphasis 628 increases signal magnitude just after the signal transition as shown. FIG. 6D illustrates the signal plot 620 with both pre-emphasis 624 and post-emphasis 628 added to the signal plot. As shown, due to the emphasis, signal portions prior to and after the signal transitions have increased magnitude.

Figure 7:
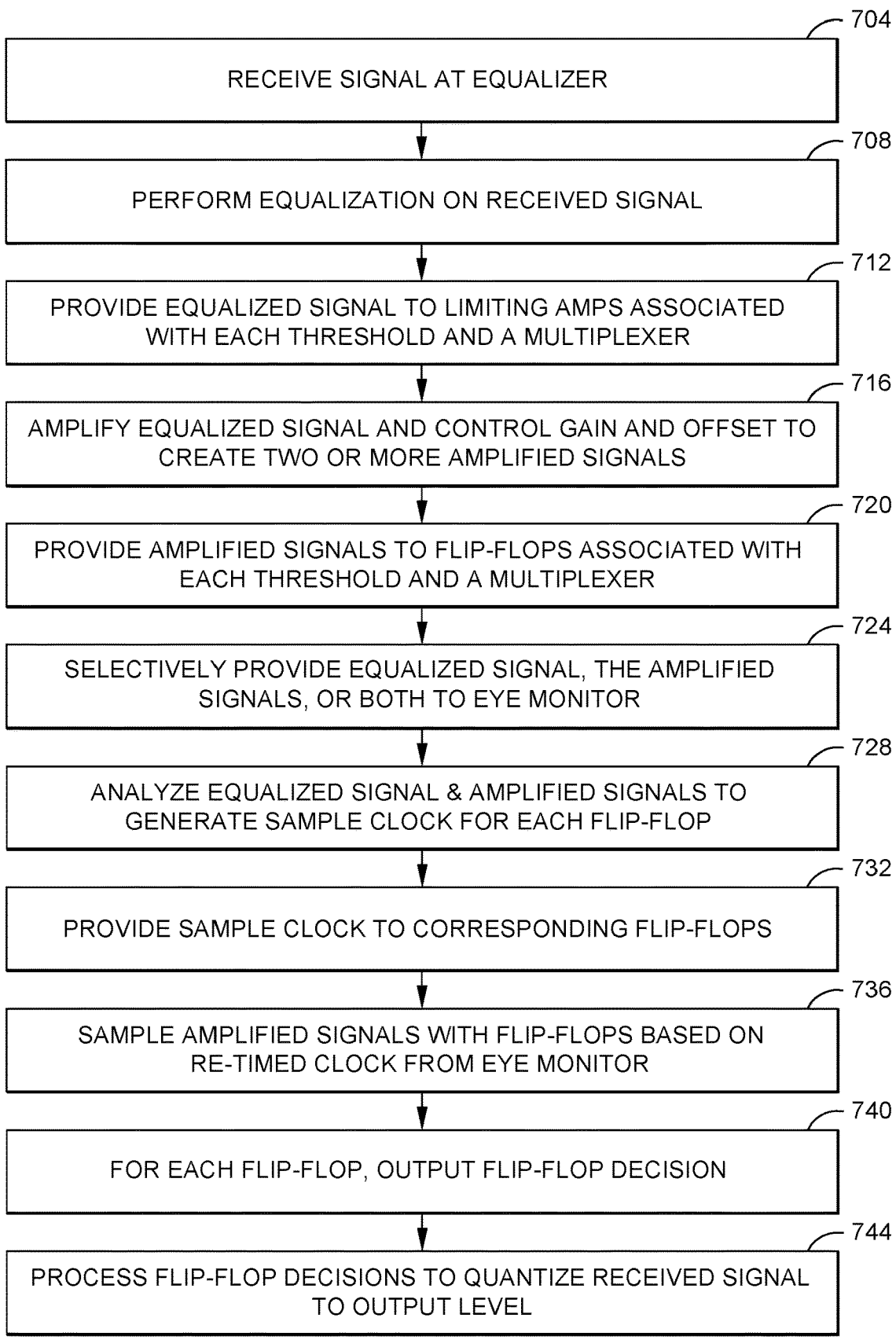
FIG. 7 is an operational flow diagram of one example method of operation for the system of FIG. 4.

FIG. 7 is an operational flow diagram of one example method of operation for the system of FIG. 4. This is but one possible method of operation and it is contemplated that other methods of operation may occur without departing from the claims that follow. At a step 704, the equalizer receives a signal that is from a channel or other upstream processing element. The signal is to be retimed, such as clock and data recovery. Next, at a step 708 the system performs equalization on the received signal and provides the equalized signal to a limiting amplifier. A limiting amplifier may be associated with or provided for each sampling threshold. Thus, in a PAM4 signal, which has possible four signal values when sampled, there are three thresholds, one between each possible signal value. Thus, for a PAM4 signal there would be three limiting amplifiers. Although defined herein as limiting amplifiers, it is contemplated that any type amplifier may be used that performs as disclosed herein.

At a step 712 the equalized signal is provided to a multiplexer and distributed into separate lanes, each of which include a limiting amplifier and a flip-flop. The limiting amplifiers amplify the equalized signal based a control signal at a step 716. The limiting amplifiers may also control signal offset individual in each lane. The control signal may arrive from an eye monitor or other control element. The gain, offset, or both may be controlled by the control signal. At a step 720 the amplified signals are provided a multiplexer and to a flip-flop in each lane, or any other type latching device, as is shown in FIG. 4. In this example embodiment, a flip-flop is associated with each amplifier but in other embodiments other arrangements or logic may be used.

Figure 3A:
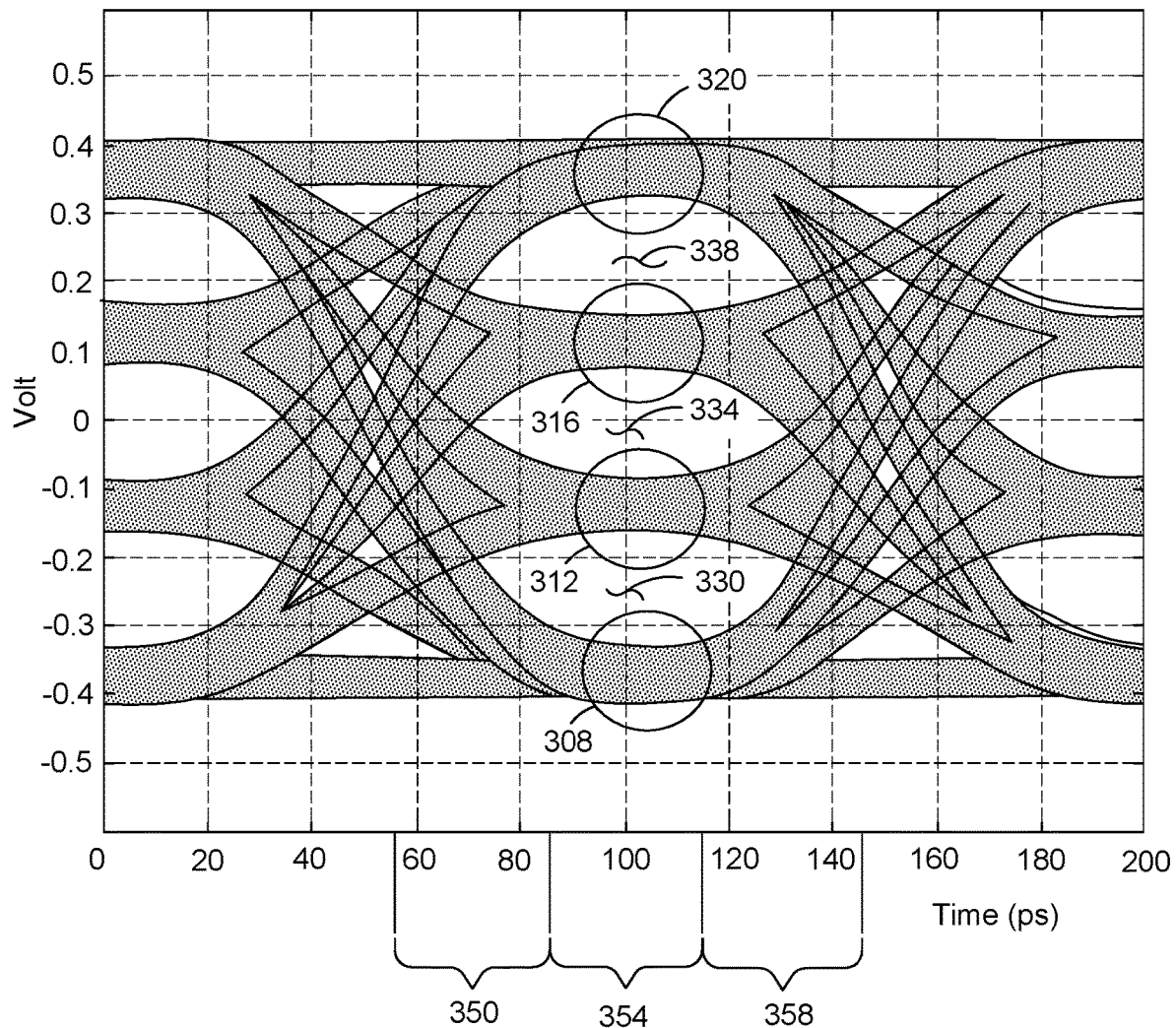
FIG. 3A illustrates an exemplary PAM4 signal.
Figure 3B:
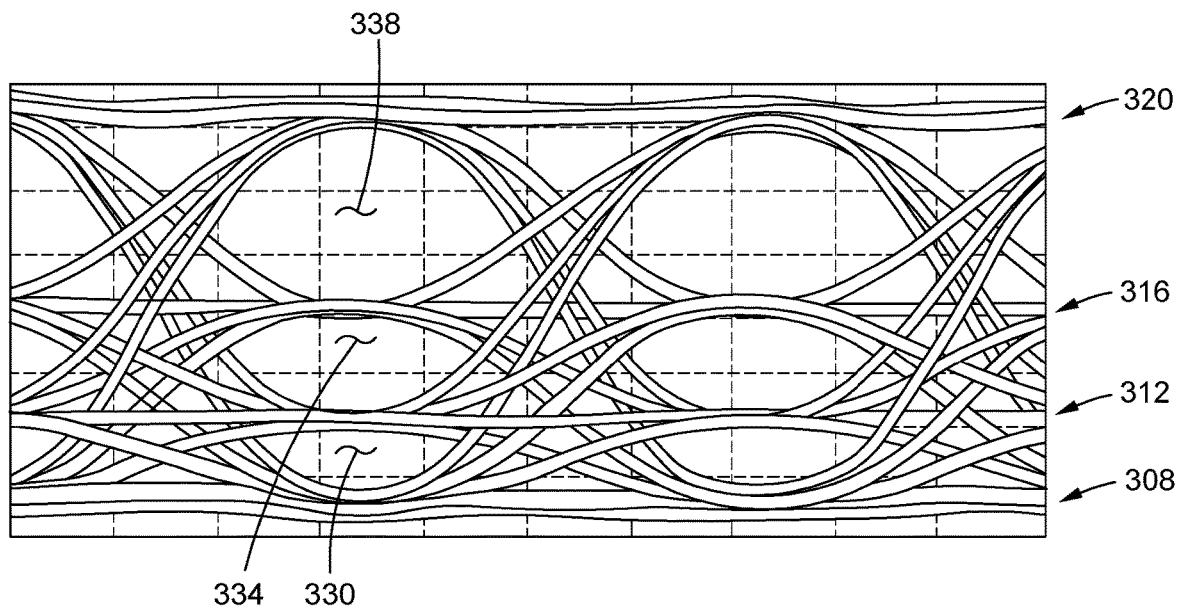
FIG. 3B illustrates an exemplary PAM4 signal that has signal compression.
Figure 3C:
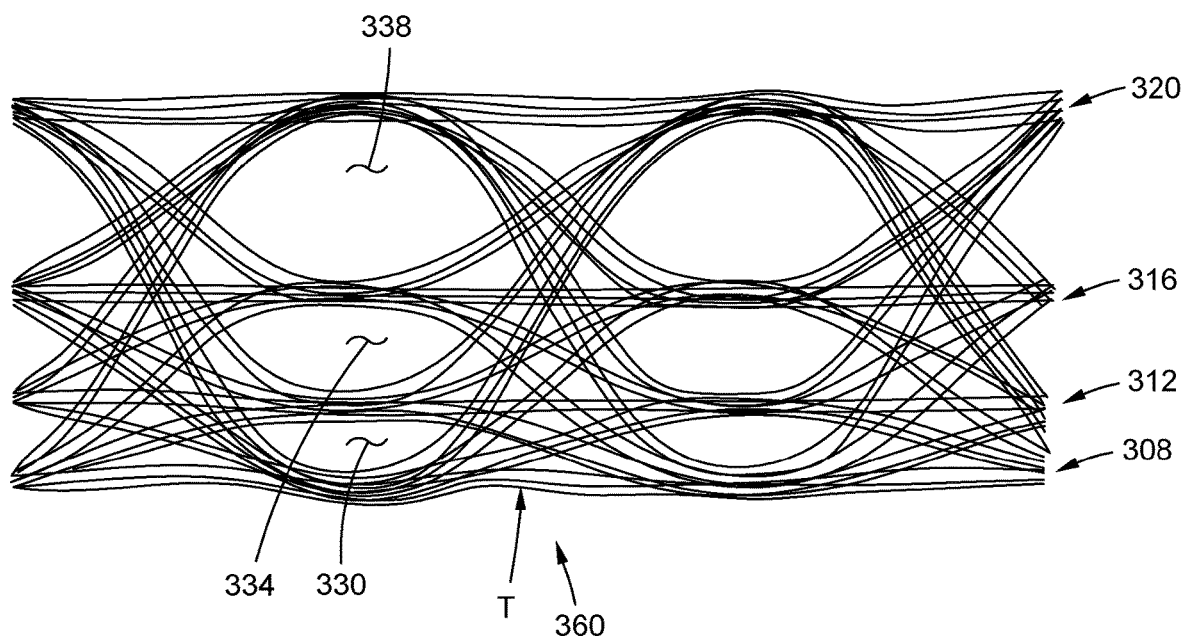
FIG. 3C illustrates an exemplary PAM4 signal that has skewed input eyes due to unequal laser rise and fall times.

At a step 724 the multiplex, responsive to a control signal, selectively provides the equalized signal and the amplified signals to the eye monitor. At a step 728, the eye monitor analyses the equalized signal and the amplified signals to generate a sample clock phase signal for the flip-flops. In this embodiment, a separate unique retiming signal is provided to each flip-flop. The sample (retiming) clock phase signal controls time at which the flip-flops sample the amplified signal. In one embodiment the eye monitor analyses each signal to determine an ideal time for each flip-flop to sample the signal. It is contemplated that each flip-flop, responsive to the retiming clock phase signal, may sample the signal at a different time to thereby account for timing skew between each eye. An example of timing skew is shown in FIG. 3C. At a step 732, a retiming clock phase signal is provided to each flip-flop. At step 736, the flip-flops sample the amplified signal based on the retimed clock phase signals from the eye monitor.

At a step 740, each flip-flop outputs its flip-flop decision and the flip-flop outputs are processed to generate a value representing the value of the received signal at each sampling time. This occurs at a step 744.

Figure 8A:
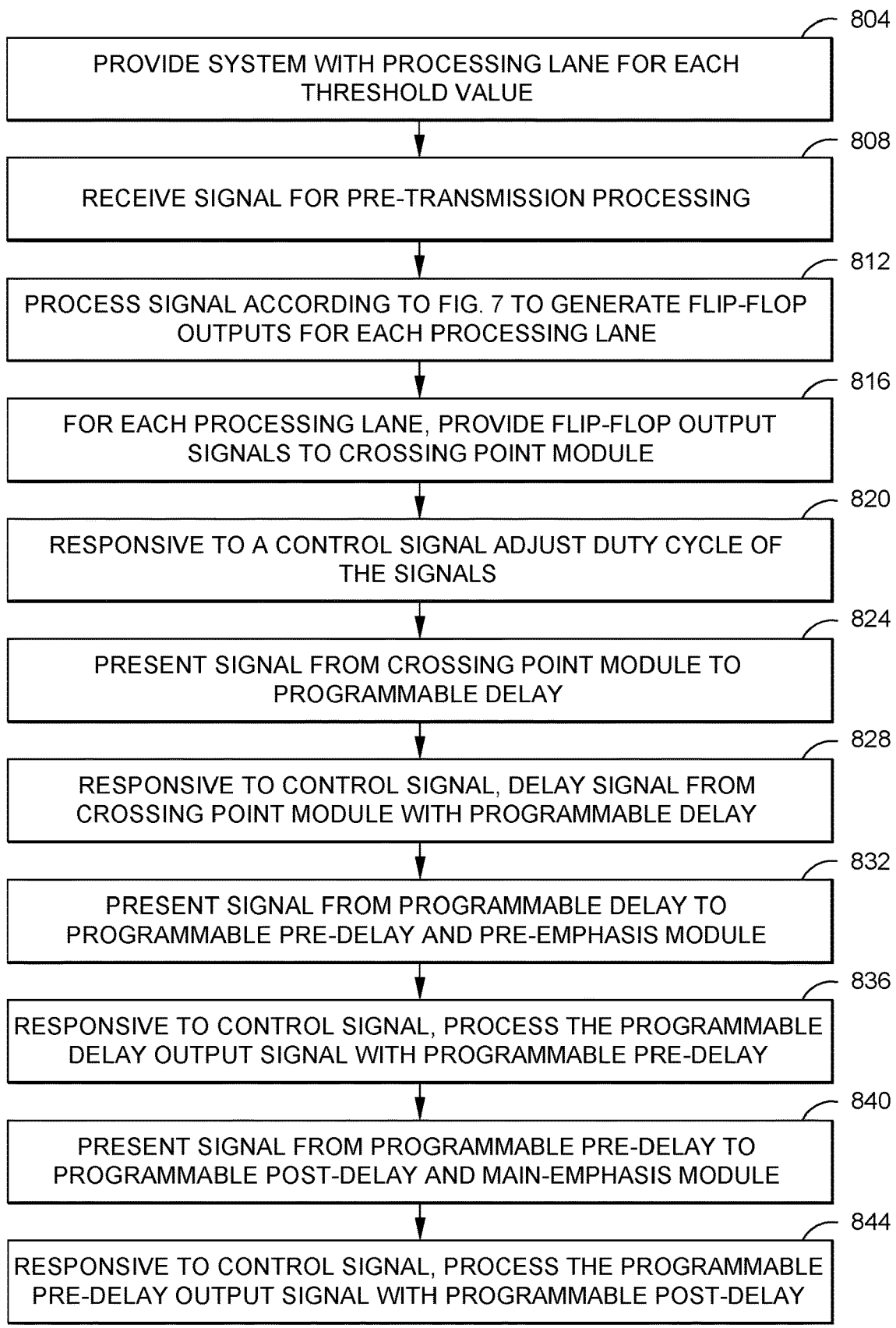
FIGS. 8A and 8B are operational flow diagram of one example method of operation for the system of FIG. 5.
Figure 8B:
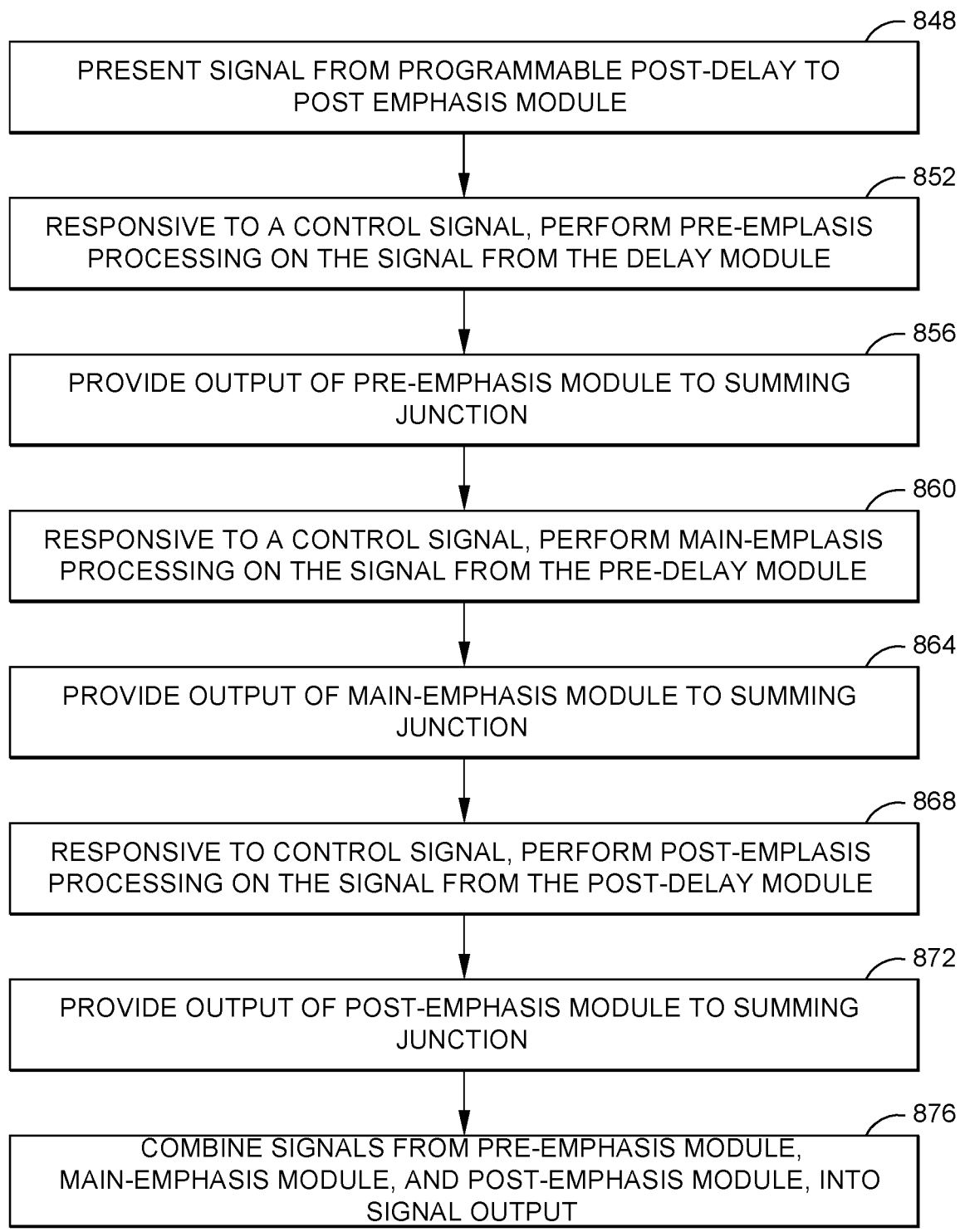

FIG. 8A and 8B are operational flow diagram of one example method of operation for the system of FIG. 5. This is but one possible method of operation and it is contemplated that one of ordinary skill in the art may arrive at other methods of operation that do not depart from the claims that follow. At a step 804, a system is provided with separate lanes, such as a lane for each threshold value between possible signal values or each signal eye. An example of such a system is shown in FIG. 5, which has three processing lanes for use with a PAM4 signal. At a step 808, a signal is received by the system for processing, such as pre-transmission processing or after the signal passes through a channel. Then, at a step 812 the system processes the signal according to the discussion of FIG. 4 and FIG. 7 to generate flip-flop outputs.

At a step 816 the flip-flop output signals are provided crossing point modules. This is an optional step which may be performed by the flip-flops. At a step 820, responsive to a control signal, the crossing point module adjusts the duty cycle of the signals. At a step 824 the signals from the crossing point module are provided to a programmable delay. The programable delay receives a control signal and, at a step 828 the signal is delayed with the programmable delay. The amount of delay is based on the control signal. After processing by the delay, at a step 832 the delayed signal is provided to a programmable pre-delay and a pre-emphasis module. Next, at a step 836, responsive to a control signal, the system processes the programmable delay output signal with the pre-delay to introduce pre-delay into the signal. Then, at step 840 the resulting signal, with pre-delay introduced, is provided to a programmable post-delay and a main-emphasis module.

At a step 844, responsive to a control signal, the programmable pre-delay output signal is processed with the programmable post-delay to introduce post-delay into the signal. The resulting post-delayed signal is provided to a post-emphasis module at a step 848. Then at a step 852, responsive to one or more control signals provided to the pre-emphasis module, the pre-emphasis module introduces pre-emphasis into the provided signal. At a step 856, the system provides the output of the pre-emphasis module to a summing junction.

Then at a step 860, responsive to one or more control signals provided to the main-emphasis module, the main-emphasis module introduces emphasis into the provided signal. At a step 864, the system provides the output of the main-emphasis module to a summing junction. At a step 868, responsive to one or more control signals provided to the post-emphasis module, the post-emphasis module introduces post-emphasis into the provided signal. At a step 872, the system provides the output of the post-emphasis module to a summing junction.

Next, at the summing junction, the signals are combined. This occurs at a step 876. Devices other than a summing junction may be used. The summing junction combines the signals to re-constitute the original signal, but the output of the summing junction is retimed and improved in quality. The signal output from the summing junction may be transmitted from system, such as over a wired or optic channel, or provides to a downstream system for further processing.

The method of FIG. 8 may occur for each lane, such as in reference to FIG. 5, over three lanes in a PAM4 system. Thus, a lane of processing elements may be provided for each of the threshold levels, such that a PAM4 system has three threshold levels (see FIG. 3A). This system and method provide and advantage of prior art systems for processing the signals based on each threshold level thereby improving the signal individually in each processing lane. This in turn opens and aligns each eye. Thus, timing skew (FIG. 3C) between lanes is corrected and compression of each eye (FIG. 3B) may be corrected.

Figure 9:
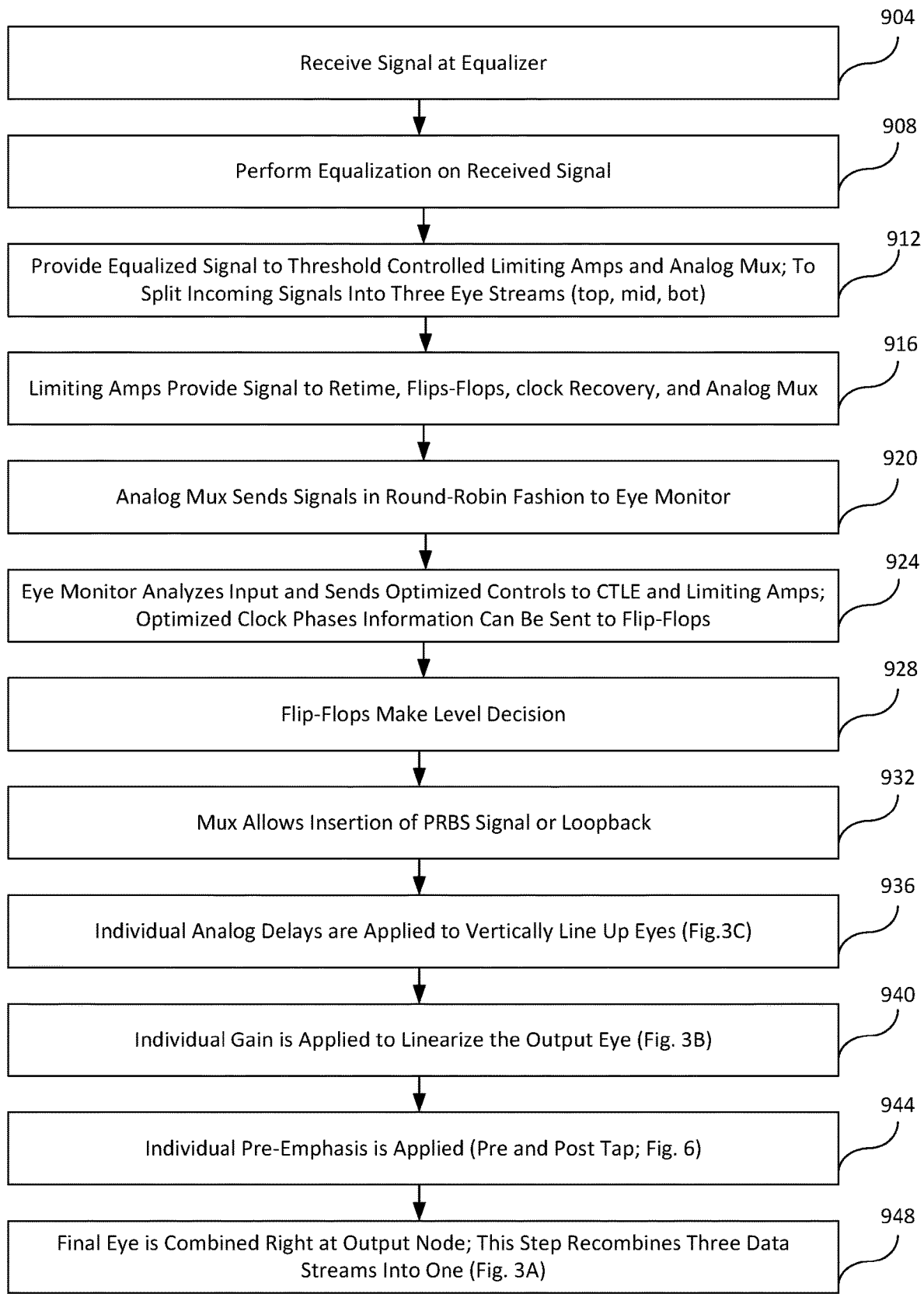
FIG. 9 illustrates an operational flow diagram of a simplified method of operation.

FIG. 9 illustrates an operational flow diagram of a simplified method of operation. This is but one possible method of operation and it is contemplated that other methods are possible which do not depart from the claims that follow. At a step 904, the system receives a signal for clock data recover at an equalizer. At a step 908, the equalizer performs equalization on the received signal. Next, at a step 912, the system provides the equalized signal to a threshold controlled limiting amp and an analog multiplexer. This step splits incoming signal into three eye streams on three different lanes (top, mid, and bottom).

At a step 916 the limiting amplifiers provide the amplified signals to the re-time flip-flops, a clock recovery module and an analog multiplexer. Next, at a step 920 the analog multiplexer sends the equalized signal and the amplified signals, in round-robin fashion, to the eye monitor. The, at step 924 the eye monitor analyzes the input and sends optimized control signals to the equalizer (CTLE) and limiting amps while optimized clock phases information is sent to the flip-flops.

At a step 928 the flip-flops sample the signal to make a decision regarding the signal magnitude in relation to a threshold level associated with the flip-flops. Each flip-flop has a different threshold value. For each flip-flop, if the amplified signal is greater than the threshold, then the flip-flop output is a logical 1 while if the amplified signal is less than the threshold, then the flip-flop output is a logical 0 value. Next, at a step 932, the multiplexer allows insertion of a PRBS signal or loopback. At a step 936, individual analog delays are applied to vertically line-up the signal eyes for the signal in each lane. This step corresponds to the delays 528, 532, 536 shown in FIG. 5 to correct the signal issue shown in FIG. 3C.

Next, at a step 940 individual gain is applied to linearize the output of the eye. This corrects the signal defects shown in FIG. 3B. At a step 944 individual pre-emphasis is applied to the signal in each lane using the emphasis modules 540, 544, 548. The emphasis may be pre-emphasis, main emphasis and post-emphasis. At a step 948, the final eye is combined at the output node by re-combining the output from each lane. The recombining may occur with a summing junction. The resulting signal thus is improved as shown in FIG. 3A.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

The components in the figures are not necessarily to scale, emphasis instead being placed upon illustrating the principles of the invention. In the figures, like reference numerals designate corresponding parts throughout the different views.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A method for signal clock and data recovery comprising receiving a signal for clock and data recovery;
   performing equalization on the signal to create an equalized signal, the equalization configured to reverse effects of a channel on the signal;
   presenting the equalized signal to an eye monitor and at least a first amplifier and a second amplifier;
   responsive to a first control signal, amplifying the equalized signal with the first amplifier to generate a first amplified signal;
   providing the first amplified signal to the eye monitor and a first flip-flop;
   responsive to a second control signal, amplifying the equalized signal with the second amplifier to generate a second amplified signal;
   providing the second amplified signal to the eye monitor and a second flip-flop;
   processing the equalized signal, the first amplified signal and the second amplified signal with the eye monitor;
   sampling the first amplified signal with the first flip-flop in relation to a first threshold based on the first retiming clock phase signal to generate a first flip-flop output;
   sampling the second amplified signal with the second flip-flop in relation to a second threshold based on the second retiming clock phase signal to generate a second flip-flop output; and
   processing at least the first flip-flop output and the second flip-flop output to determine a value of a received signal when sampled.

2. The method of claim 1 wherein the first amplifier and the second amplifier are limiting amplifiers with offset correction.

3. The method of claim 1 further comprising a multiplexer configured to receive the equalized signal, the first amplified signal and the second amplified signal and, responsive to a multiplexer control signal, selectively provide the equalized signal, the first amplified signal and the second amplified signal to the eye monitor.

4. The method of claim 1 further comprising generating a first retiming clock phase signal for the first flip-flop and a second retiming clock phase signal for the second flip-flop, and providing the first retiming clock phase signal to the first flip-flop and the second retiming clock phase signal to the second flip-flop, such that the first retiming clock phase signal and the second retiming clock phase signal control sampling time.

5. The method of claim 1 wherein the first flip-flop and the second flip-flop are BiCMOS technology.

6. The method of claim 1 further comprising:
   presenting the equalized signal to a third amplifier;
   responsive to a third control signal, amplifying the equalized signal with the third amplifier to generate a first amplified signal;
   providing the third amplified signal to the eye monitor and a third flip-flop;
   when processing the equalized signal, the first amplified signal, and the second amplified signal, also processing the third amplified signal with the eye;
   sampling the third amplified signal with the third flip-flop in relation to a third threshold based on a third retiming clock phase signal to generate a third flip-flop output;
   when processing the first flip-flop output and the second flip-flop output, also processing the third flip-flop output.

7. The method of claim 1 further comprising:
   delaying the first flip-flop output with a first delay path to create one or more delayed first signals;
   delaying the second flip-flop output with a second delay path to create one or more delayed second signals;
   processing the one or more delayed first signals with at least one first emphasis module to impart emphasis into the one or more delayed first signals to create one or more first output signals which are provided to a summing junction;
   processing the one or more delayed second signals with at least one second emphasis module to impart emphasis into the one or more delayed second signals to create one or more second output signals which are provided to the summing junction; and
   combining the one or more first output signals and the one or more second output signals with the summing junction to create a retimed signal.

8. The method of claim 7 wherein the first delay path and the second delay path comprise a programmable main delay, a programmable pre-delay and a programmable post-delay.

9. The method of claim 8 wherein the at least one first emphasis module and the at least one second emphasis module comprise a pre-emphasis module, a main-emphasis module, and a post-emphasis module.

10. A system for retiming signals comprising:
an input configured to receive a signal;
an equalizer configured to perform equalization on the received signal to create an equalized signal;
two or more amplifiers configured to receive the equalized signal and, responsive to amplifier control signals, amplify the equalized signal to create two or more amplified signals;
an eye monitor configured to receive the equalized signal and the two or more amplified signals, the eye monitor configured to process the equalized signal and the two or more amplified signal to create the two or more amplifier control signals; and
two or more flip-flops configured to receive the two or more amplified signals and, sample the two or more amplified signals to create two or more flip-flop outputs.

11. The system of claim 10 wherein the received signal is a PAM4 signal.

12. The system of claim 10 wherein the two or more amplifiers comprises three limiting amplifiers and the two or more flip-flops comprises three flip-flops.

13. The system of claim 10 further comprising a multiplexer configured to receive the equalized signal and the two or more amplified signals and, responsive to a multiplexer control signal, output the equalized signal and the two or more amplified signals to the eye monitor.

14. The system of claim 10 wherein the two or more amplifier control signals comprises an individual control signal, for each amplifier, capable of controlling gain, offset, or both for each amplifier.

15. The system of claim 10 further comprising creating at least one retiming clock phase signal to adjust the sampling time for at least one of the flip-flops.

16. The system of claim 10 further comprising, following each flip-flop:
one or more delays configured to receive a flip-flop output and introduce a delay into the flip-flop output to create a delayed signal;
one or more emphasis modules configured to receive the delayed signal and introduce emphasis into the delayed signal; and
a summing junction configured to receive and combine the output of the emphasis modules into a combined signal.

17. The system of claim 16 wherein the delays include a pre-delay and a post-delay and the emphasis modules include a pre-emphasis module and a post-emphasis module.

18. A system for retiming and multi-level signal, the system comprising:
an equalizer configured to perform equalization on a received signal to create an equalized signal;
a first amplifier configured to receive and amplify the equalized signal, responsive to a first amplifier control signal, to create a first amplified signal;
a second amplifier configured to receive and amplify the equalized signal, responsive to a second amplifier control signal, to create a second amplified signal;
an eye monitor configured to:
receive the equalized signal, the first amplified signal, and the second amplified signal;
process the equalized signal, the first amplified signal, and the second amplified signal to create the first amplifier control signal and the second amplifier control signal;
provide the first amplifier control signal to the first amplifier and the second amplifier control signal to the second amplifier;
a first flip-flop configured to receive the first amplified signal and, based on a first retiming clock phase signal, sample the first amplified signal at a time controlled by the first retiming clock phase signal; and
a second flip-flop configured to receive the second amplified signal and, based on a second retiming clock phase signal, sample the second amplified signal at a time controlled by the second retiming clock phase signal.

19. The system of claim 18 further comprising:
a one or more first delays and one or more first emphasis modules configured to delay and introduce emphasis into an output from the first flip-flop to create a first output;
a one or more second delays and one or more second emphasis modules configured to delay and introduce emphasis into an output from the second flip-flop to create a second output;
a summing junction configured to receive and combine the first output and the second output to generate a combined output representing a retimed signal.

20. The system of claim 19 wherein the one or more first delays and one or more second delays each comprise a delay, a pre-delay, and a post delay, and the one or more emphasis modules include a pre-emphasis module, a main-emphasis module, and a post emphasis module.

* * * * *